(12) United States Patent
Lam

(10) Patent No.: US 7,689,630 B1
(45) Date of Patent: Mar. 30, 2010

(54) TWO-LEVEL BITMAP STRUCTURE FOR BIT COMPRESSION AND DATA MANAGEMENT

(75) Inventor: Richard Lam, San Leandro, CA (US)

(73) Assignee: Richard L. Lam, San Leandro, CA (US)

( * ) Notice: Subject to any disclaimer, the term of this patent is extended or adjusted under 35 U.S.C. 154(b) by 244 days.

(21) Appl. No.: 11/716,829

(22) Filed: Mar. 12, 2007

Related U.S. Application Data

(60) Provisional application No. 60/783,004, filed on Mar. 15, 2006.

(51) Int. Cl.
*G06F 12/00* (2006.01)

(52) U.S. Cl. .............................. 707/802; 707/E17.002

(58) Field of Classification Search ................. 707/6–7, 707/100, 200, 802, E17.002
See application file for complete search history.

(56) References Cited

U.S. PATENT DOCUMENTS

| 5,907,297 | A | * | 5/1999 | Cohen et al. .................. 341/95 |
| 6,112,208 | A | * | 8/2000 | Ikegami ....................... 707/101 |
| 6,874,062 | B1 | * | 3/2005 | Goldberg ..................... 711/117 |
| 7,092,954 | B1 | * | 8/2006 | Ramesh ....................... 707/100 |
| 2002/0133491 | A1 | * | 9/2002 | Sim et al. ...................... 707/10 |
| 2004/0090351 | A1 | * | 5/2004 | Wu et al. ....................... 341/50 |
| 2004/0111439 | A1 | * | 6/2004 | Richardson et al. ......... 707/200 |

\* cited by examiner

*Primary Examiner*—Tim T. Vo
*Assistant Examiner*—Shiow-Jy Fan

(57) ABSTRACT

A method and apparatus for encoding data from heterogeneous sources and structuring them into a common format using bitmap techniques for integration, storage, access, and performing Boolean operations to derive new meaningful results is provided. A new control layer is added to a linear bitmap to provide data compression and management. Boolean operations are efficiently performed by first at the control bits level and will perform at the data bits only if necessary. The bitmap structures can be created independently on separate computing platforms and are operable interchangeably on different platforms, without the restricted need of using a separate database management system.

9 Claims, 8 Drawing Sheets

TWO-LEVEL BITMAP STRUCTURE FOR BIT COMPRESSION AND DATA MANAGEMENT

CROSS-REFERENCE TO RELATED PUBLICATION

This application claims the benefits of provisional patent application Appl. No. 60/783,004, filed Mar. 15, 2006 by the present inventor.

REFERENCES CITED

U.S. Patent Documents

| | | |
|---|---|---|
| 6,067,540 | May 2000 | Ozbutun et al. |
| 6,266,662 | July 2001 | Ozbutun et al. |
| 5,907,297 | May 1999 | Cohen et al. |
| 7,146,416 | December 2006 | Yoo et al. |
| 5,363,098 | November 1994 | Antoshenkov |
| 6,826,563 | November 2004 | Chong et al. |

FIELD OF THE INVENTION

The present invention relates to data management, more particularly, to the maintenance, storage, retrieval, and data compression of bitmaps used to integrate and access information from heterogeneous data sources.

DIAGRAMS

Figure 4A:
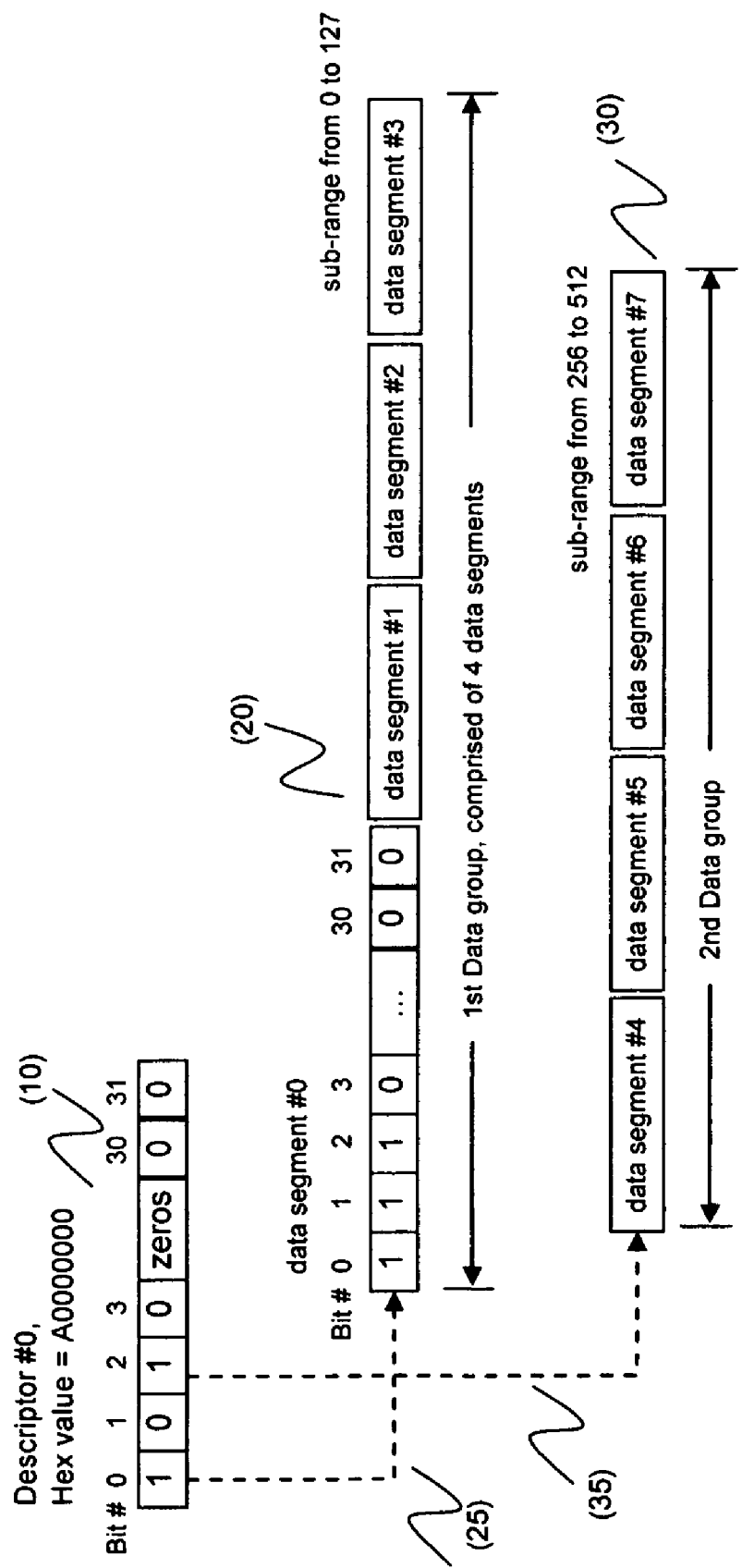
FIG. 4A is a block diagram showing a portion of the structure for a two-level bitmap, including its first Descriptor #0 and its corresponding Data groups
Figure 4B:
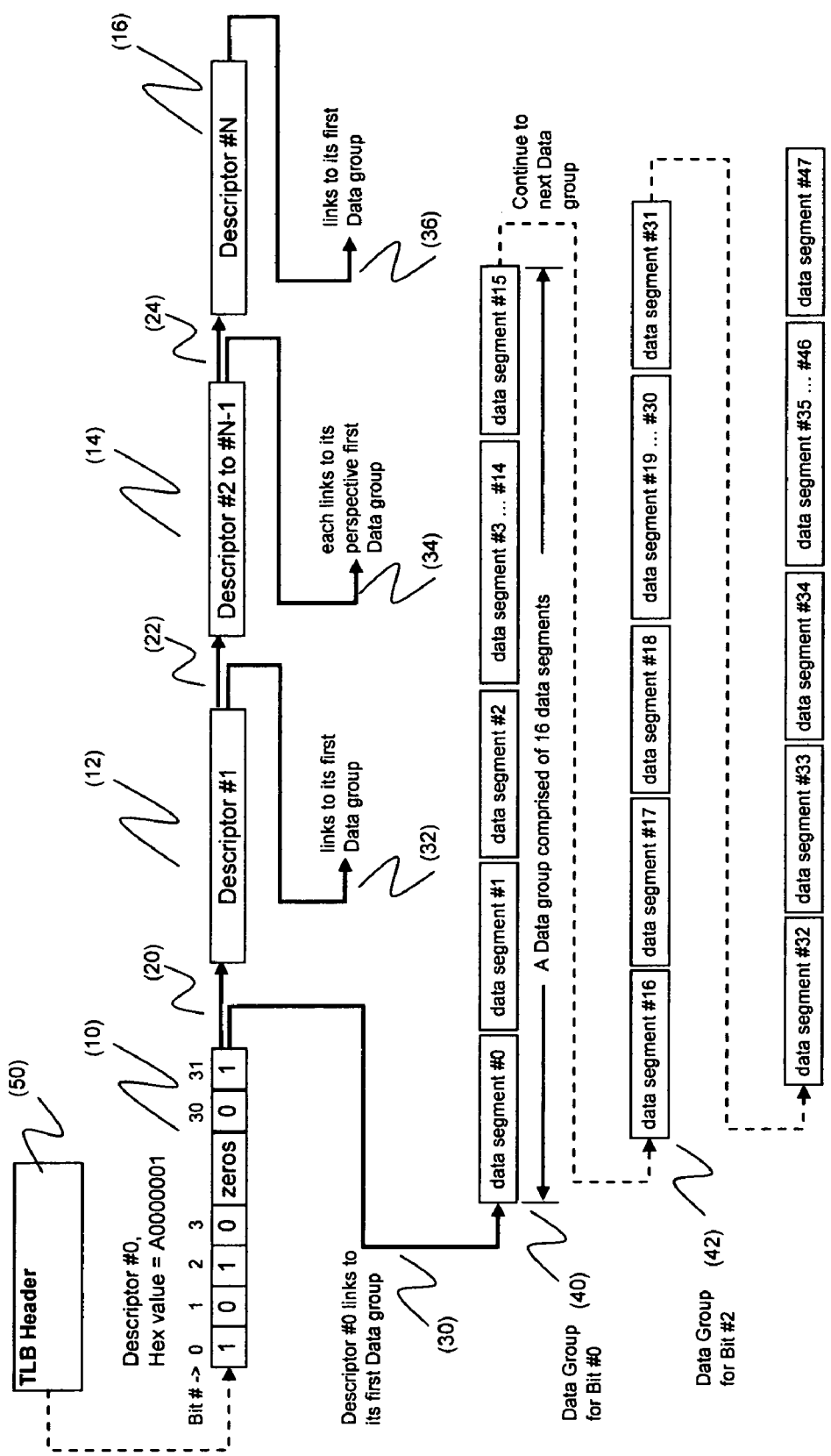
FIG. 4B is a block diagram showing the detailed structure of a two-level bitmap, which comprised of an order sequence of Descriptors and their corresponding Data groups.
Figure 4C:
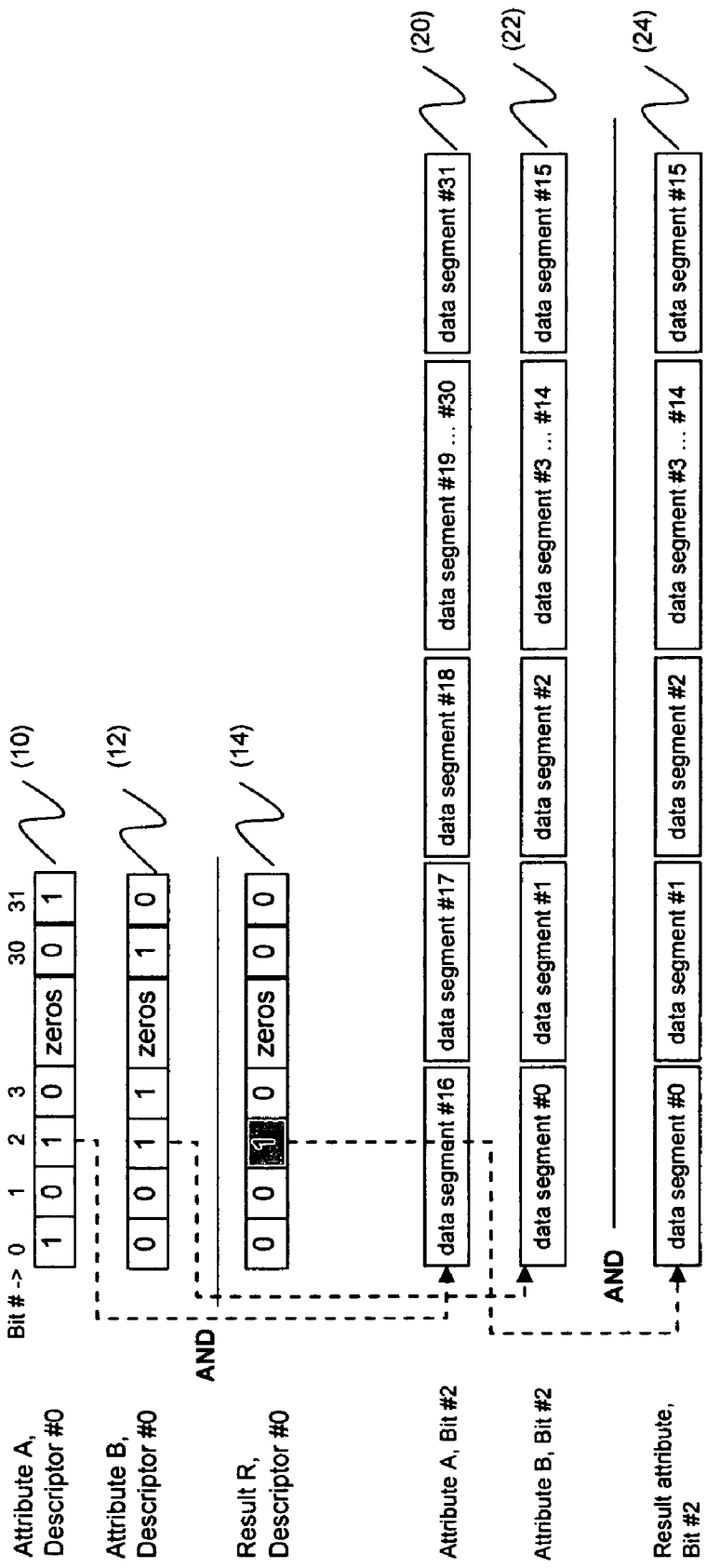
Figure 5A:
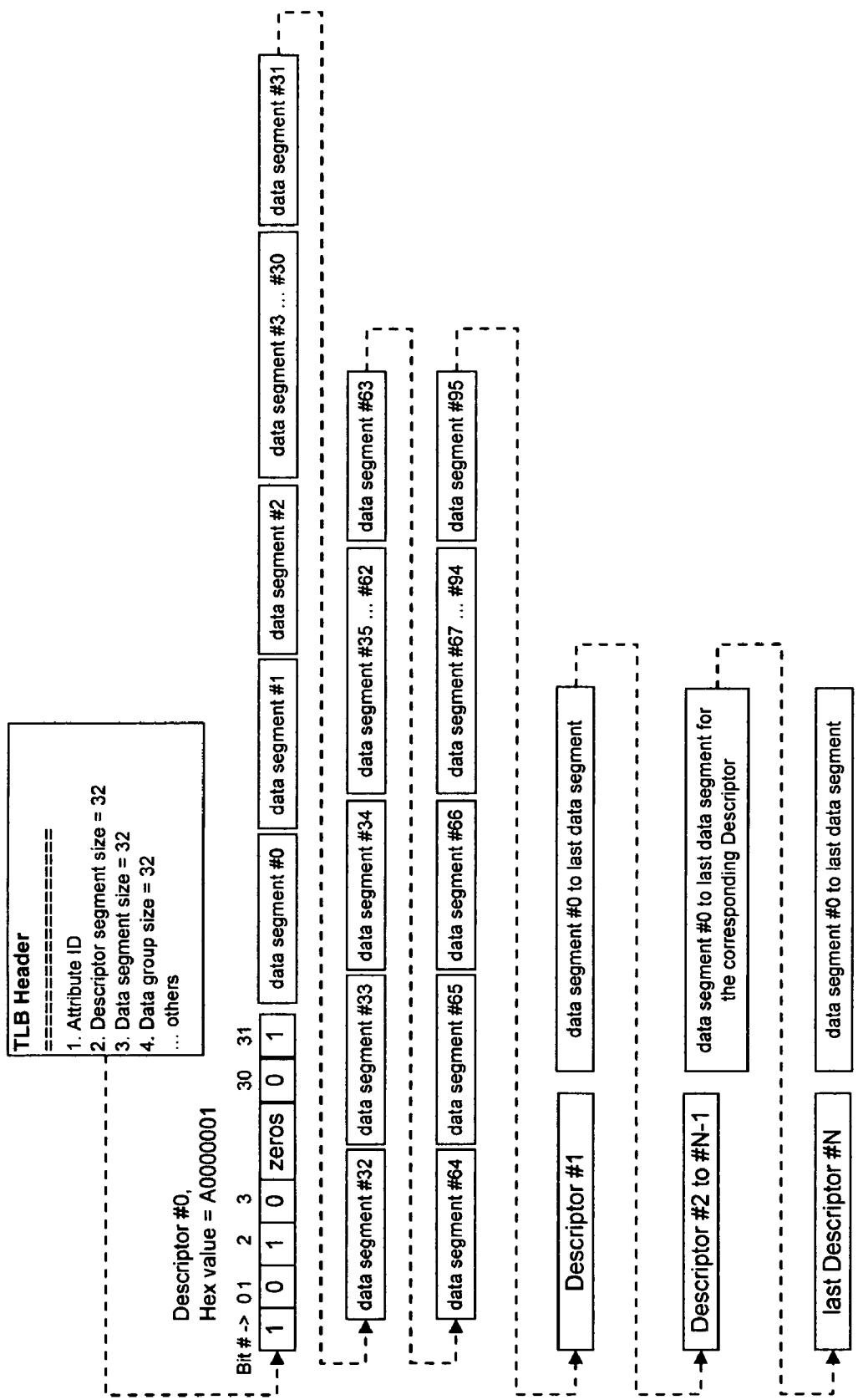
Figure 5B:
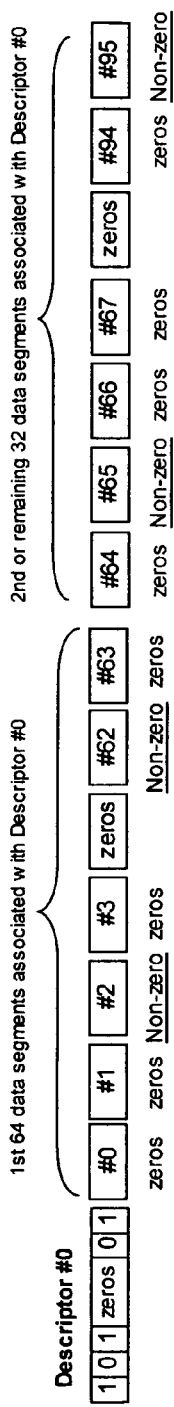
Figure 5C:
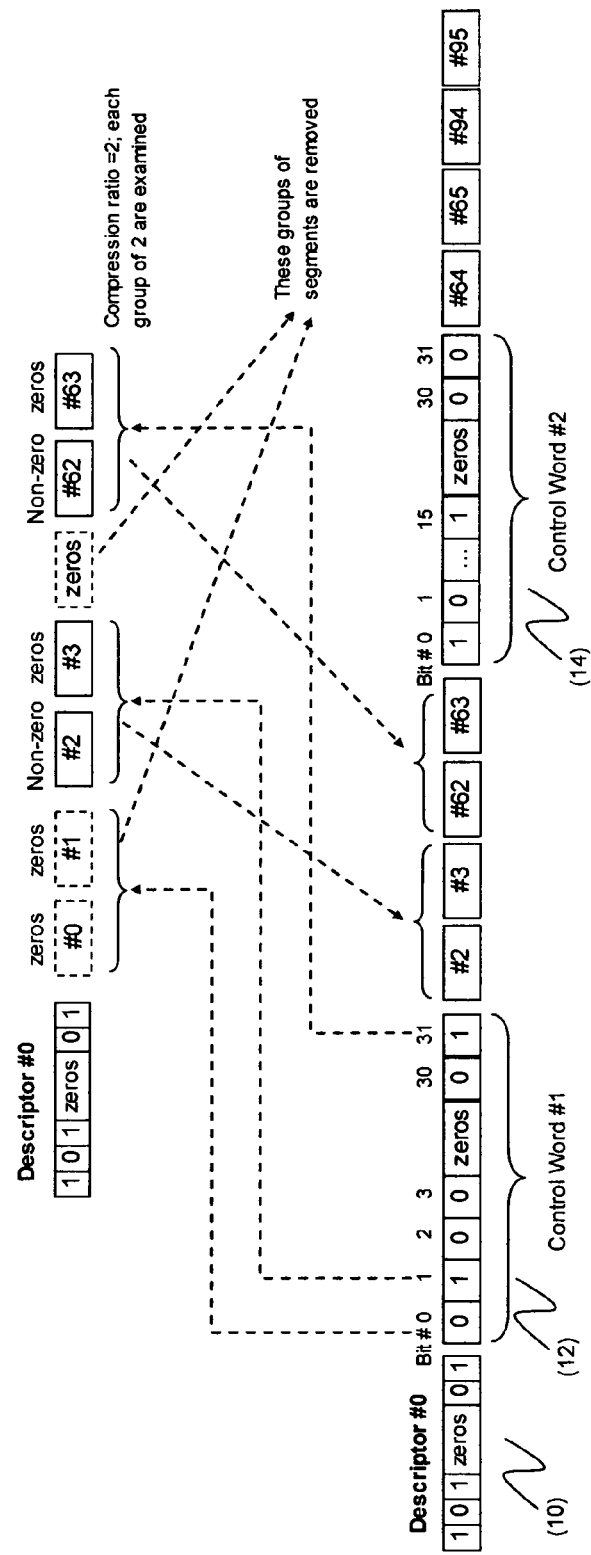

FIG. 4C is a block diagram showing an AND Boolean operation is performed between two two-level bitmaps FIG. 5A is a block diagram showing how a two-level bitmap is collapsed to a linear structure in order to save as file to disk storage FIG. 5B is a block diagram showing a sample data for a linearly structured bitmap, after collapsed from its corresponding two-level bitmap structure FIG. 5C is a block diagram showing the data compression method to compress the linearly structured bitmap

BACKGROUND OF THE INVENTION

Businesses are increasingly collecting and analyzing more information, for example, user-centric data to understand their customers by their interests, purchase patterns, demographics, and other relevant attributes. These data, however, are likely disjointed as they are collected from dispersed sources including web server logs, sales automation systems, and/or third party companies, just to name a few. A widely-used approach is to integrate data from heterogeneous sources into a centralized relational database; but such approach often requires significant and lengthy data design and programming effort and technical skills on users to perform even basic data analyses.

The collected data could be in huge volume, in the hundreds of gigabytes or terabytes. Database vendors provided such capabilities as bitmap index (Ozbutun et al., U.S. Pat. No. 6,067,540), to address the large data volume. A bitmap index typically is much smaller in size than its traditional counterpart such as binary tree index. However, such bitmap index is an integral part and tightly coupled with the inner workings of the database—an index to the database records, and can not be directly accessed and manipulated outside of the database.

A primary issue with bitmap index is the potentially large number of zero gap bits. The method by Ozbutun et al. (referenced above) is to divide a bitmap into segments, with each segment corresponds to a sub-range that corresponds to the subset of database records; each segment contains a start and end range numeric value and follows by its representative series of bits. And gap bits are reduced by not storing segments that corresponds to all non-existence database records. Such method, however, would involve every bit within a segment when a Boolean operation is performed even if a much less number of bits is required, thereby potentially wasting computing resources and degrading performance. A case example would be performing an "AND" between two segments, each with a sub-range, say of 1000 and each only has one "1" bit, then all 1000 bits would be "AND", although much less number of operations may be necessary.

SUMMARY DESCRIPTION OF THE INVENTION

The present invention provides an apparatus and method to encode and transform the original source data into a common format based on an "event-participants" data model, and storing the data using an improved bitmap indexing technique, a two-level bitmap structure. The invention provides a simpler technique to integrate data from heterogeneous sources and to perform SET, or Boolean operations for data analyses and other useful applications.

One aspect of the invention is an improved bitmap structure, herein refers to as "two-level bitmap" (TLB), providing improved bitmap segmentation techniques and addressing scheme. A new layer of control bits is added to provide data compression and management for the segmented data bits. Boolean operations are performed first at the control bits level and would perform at the data bits level only if necessary.

TLB has an architecture in which its structural characteristics are configurable to optimize for the specialized characteristics of the data to minimize gap bits and the computing environment, for example, to align its segments size to that of the CPU/memory's size thereby reducing execution overheads to achieve optimal performance. TLB can be saved and retrieved independently to and from disk storage and manipulated for Boolean and other operations. TLB is further compressed to reduce its size so that it can be retrieved entirely or selectively into memory and operating in memory for optimal performance.

DETAIL DESCRIPTION OF THE INVENTION

Data Encoding and Integration

Definitions and Usages for Attributes and Bitmaps

In this context, an event-participant model refers to associating a collection of participant or correspondent data objects to an event, or more generally, an attribute. The said associations between an attribute and their corresponding data objects are represented by a bitmap, more specifically by a two-level bitmap.

A specific population of data objects is defined, where common attributes and their associations with their correspondent subset of data objects are created. The referred data objects can be any physical entities that include but not limited to person names, browser cookies, documents, or others that each has a uniquely represented name. A population's size could be large but has a predefined upper bound; new member objects can be added or joined with the population at a later time than when it was initially created.

In this context, a bitmap is a series of bits, with each bit corresponds to a unique object within the population. Each bitmap is associated with an attribute and the state of its bits, either "1" or "0", indicates whether the bit's corresponding object has a direct correspondence with the attribute, "1" as Yes and "0" as No.

Each bit within a bitmap is uniquely identified by its position, or an absolute address, and each object has an assigned unique and fixed signature identifier based on its unique name. A bit is corresponds to the object with the same signature value as the bit's address; in the same way, an object corresponds to a bit with the same bit address as the object's signature value. For example, an object with a signature identifier of 100 corresponds to bit at position #100 and vice versa.

Any well-known hashing techniques, such as CRC (Cyclic Redundancy Check) and MD5 (Message-Digest algorithm 5), or a combination with custom techniques, can be used to convert or translate an object's unique name, which is in form of character strings or symbols represented as single or multi-bytes, into a unique and consistent integer identifier.

Figure 1A:
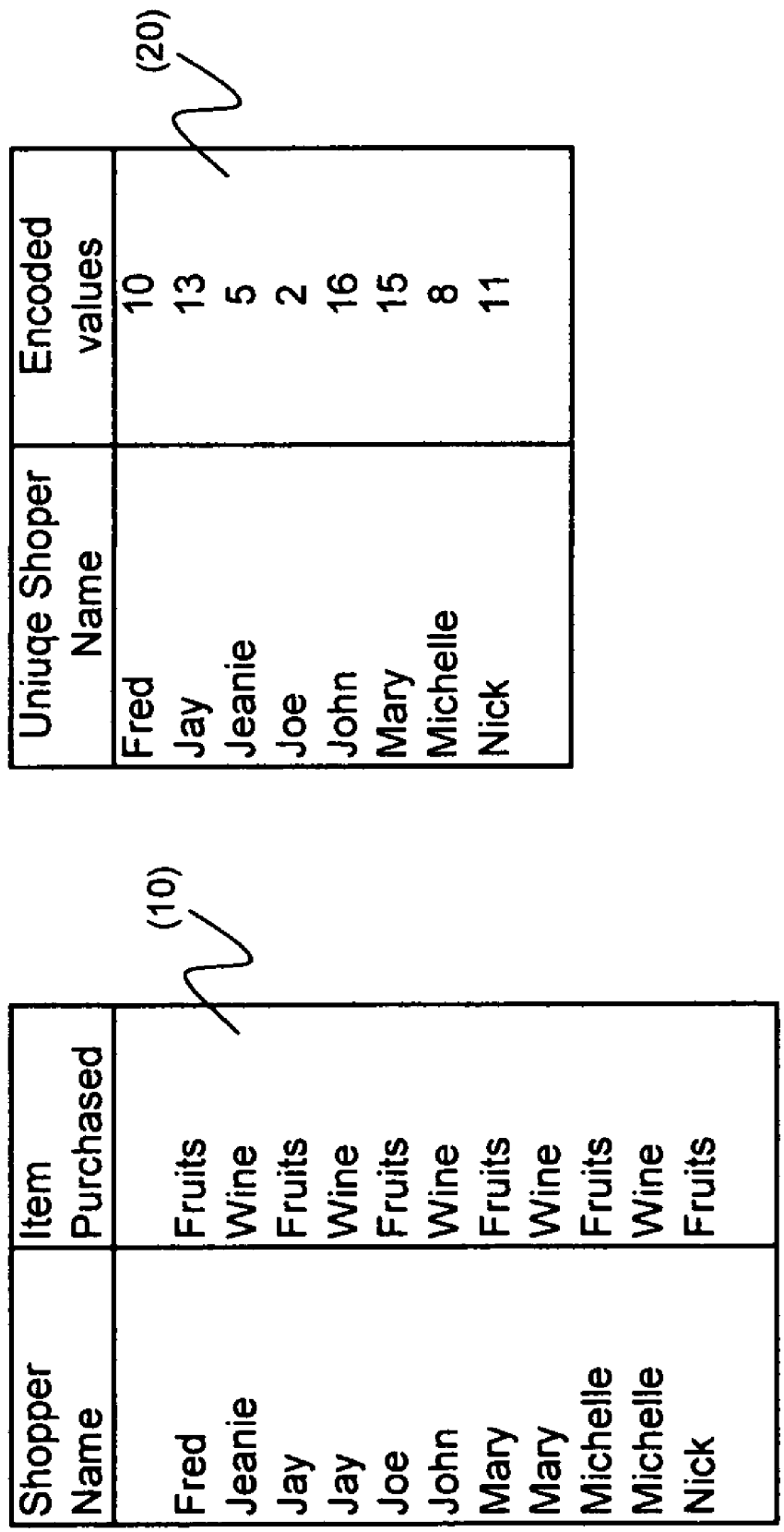
FIG. 1A is a block diagram showing a sample data of shoppers, with each name encoded to a unique signature identifier.

FIG. 1A shows an example of an extracted list of shoppers is used to create a population—(10), with their associations with two attributes, purchase of Fruits and Wine. The encoded values for each corresponding shopper are shown in (20), given the maximum population size as 20.

Figure 1B:
FIG. 1B is a block diagram showing the encoding process generates consistent signature identifiers for existing member objects and new unique values for new member objects.
Figure 1B:

FIG. 1B shows another extracted list, which can be from a different source and/or at a different time, with a combination of existing and new shoppers, shown in (30). The two new attributes for this group are hobby for Sports and Music. The encoding process generated the same signatures for existing shoppers and new unique signatures for the new shoppers, shown in (40); the three new shoppers include Howard, Sophia, and Tom, with encoded signatures as 9, 19, and 20, respectively.

Figures 2, 3:
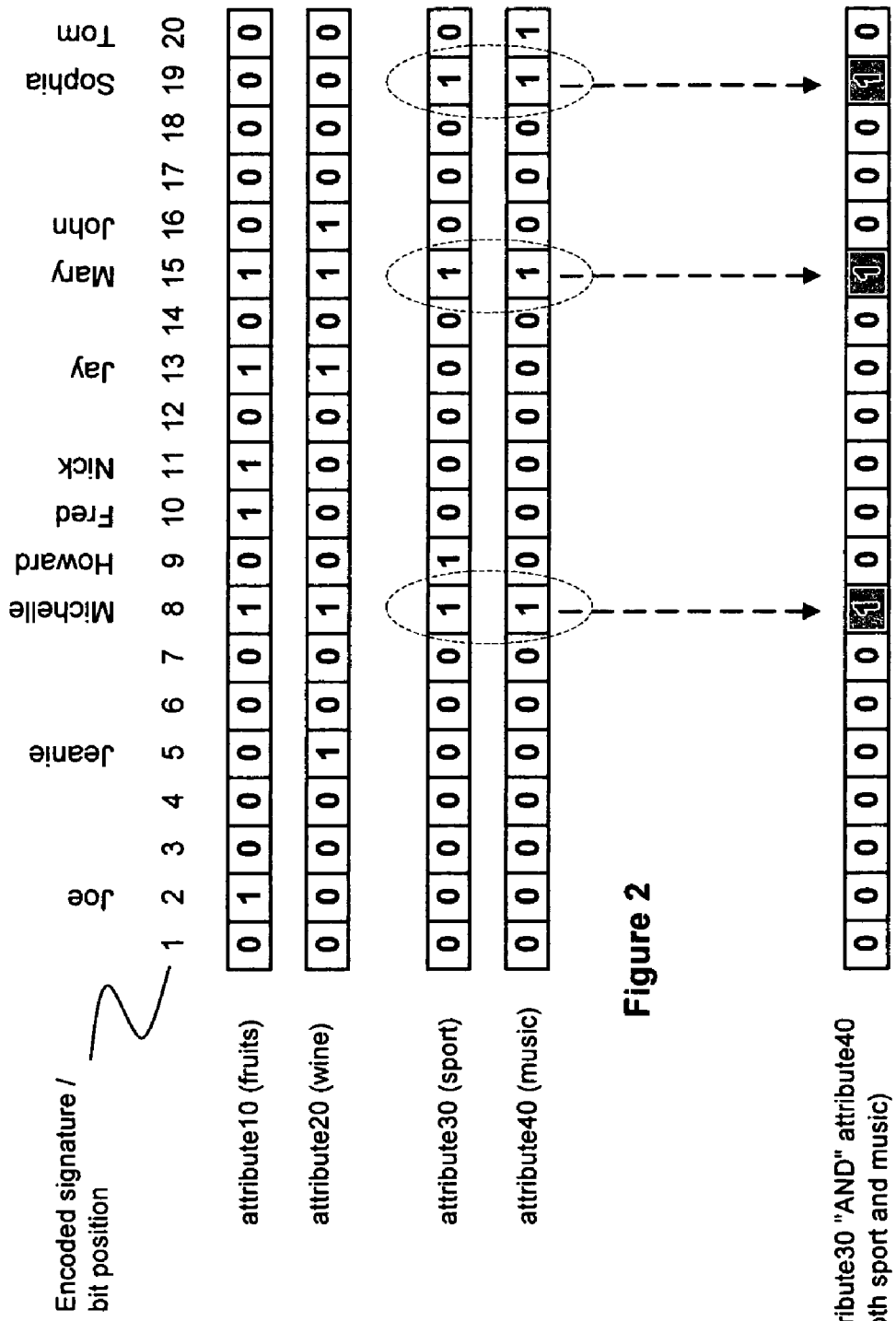
FIG. 2 is a block diagram showing bitmap representations for the associations between attributes and their corresponding data objects.
FIG. 3 is a block diagram showing the result of performing an "AND" between two attributes cited in FIG. 2.

FIG. 2 shows the associations between attributes and its corresponding objects, shoppers for this example, and are represented by bitmaps (this is for illustration of concept, a two-level bitmap would be used for actual implementation). Currently, there are 11 members out of a possible of 20 for the population; the other missing members may appear for a different attribute at a later time. The zero bits within an attribute are referred to as "gap" bits, for example, bit position #1, 3, 4, 5, etc. in attribute 10.

New useful result can be derived by performing Boolean operations between attributes. FIG. 3 shows the result of performing a "AND" between attribute30 and attribute40, with bitwise "AND" between corresponding bits of the two attributes; this result provides all members that have both Sports and Music as hobby, hence include Michelle, Mary, and Sophia at bit position #8, #15, and #19, respectively.

A population can be created differently for the same data sources, in accordance to the tracking granularity. For example, key words extracted from its corresponding documents' text can be the attributes while the documents itself as the participant objects. However, to track the relationship between key words and the corresponding documents and specific pages within the document, the represented name for the correspondent object can be the concatenation of the documentation name and page number, as long as it is unique, for example, in the form of "document Name.page1". For even more detail level to the specific line within a page, the object can be named by concatenating document, page, and line.

Attribute is Self-Contained Data Entity

An attribute is self-contained and transportable data entity unit. Attributes can be created from the same or different data sources, stored independently of each others but can be transported to a common location, if necessary, to take part in any formula of Boolean operations to derive new result attributes; Boolean operations include "AND", "OR", "NOT", and others.

For example, an attribute A can be "AND" with attribute B, both as operands, to produce a result attribute C as in the formula:

C=A "AND" B

The result attribute C would have the same configuration characteristics as other attributes in the same population and can be used an input operand to subsequent Boolean operations, for example, F=(C "AND" D) "AND" (C1 "XOR" C2), where D, C1, and C2 are attributes for the same population.

Attribute Components Integration

An attribute can have attribute components, where each component contains a partial subset of the overall participant data objects. Attribute components can be collected and processed on separate computing servers concurrently and independently, and can be brought together and integrated into a single attribute by performing "OR" among the components, for example:

A=$A_1$ "OR" $A_2$ "OR" $A_N$ where A is the parent attribute and $A_1$ to $A_N$ are its corresponding child attribute components. Attribute components can exist independently, integration with the parent attribute is optional. Among many reasons, this could be the result of source data residing on different host computing systems, for example, web server logs collected from a farm of separate web servers.

Attribute Group Integration

Some data analyses are more relevant to treat a collection of similar attributes as one unit, for example, an attribute group as "digital camera" is consisted of all brands and makes of digital camera stocked.

Two or more attributes can be combined, or integrated, as a new attribute group. An attribute group is itself an attribute and can perform Boolean operations with other attributes or attribute groups. An attribute group is created by performing "OR" among all its related attributes. An attribute group's collective data objects are the union of its related attributes' data objects. Grouping of attributes can be extended to a multi-level hierarchy, where any parent node can be an attribute group, produced by integrating its corresponding related attributes.

Two-Level Bitmap Structure

Two-Level Bitmap Segmentation and Structure

Every attribute, described above, is associated to a Two-Level Bitmap (TLB), where a TLB segments a bitmap into bit segments, which herein refers to as data segments, of equal length; each data segment corresponds to a sub-range of consecutive bit addresses, with each bit address corresponds to the data object with the same signature identifier in the corresponding EP population. A plurality of such contiguous data segments formed a Data group.

A new layer of control segments, which herein refers to as Descriptor segments, is added, where each Descriptor bit corresponds to a Data group. The Descriptor bit is set to "1" if its corresponding Data group has at least one non-zero data segment; otherwise, it is set to "0", indicating that the corresponding sub-range contains all-zero Data groups that consist of all gap bits and will not be stored. This method provides data compression, where a single control bit could replace a multitude of gap bits. A Descriptor collectively spans the start and end sub-range, inclusively, of its first and last bit.

The number of data segments within a Data group, which herein refers to as Data group size, is configurable to any positive integer value. This value could be optimally set to the largest value that would cover, or eliminate, the greatest number of sub-ranges of gap bits, therefore, providing the greatest data compression.

FIG. 4A shows the first Descriptor #0—(10) for a TLB, with its bit #0 and #2 set to "1", therefore, each of these set bit corresponds to Data group (20) and (30) respectively, and the correspondences are shown as dotted line (25) and (35), respectively. The Data group size is configured to 4, therefore, the sub-range covers by Data group (20) is from 0 to 127 and (30) is from 256 to 512. Descriptor #0's bit #1 and #3 through #31 is set to "0", corresponding to Data groups with data segments that contain all-zero gap bits. Although these Data groups cover its perspective sub-ranges, they are not stored physically. Description on the sub-range addressing scheme is provided below.

The number of bits within a segment, including Descriptor and data segment, is configurable to any positive integer value. It would be optimally set to match the size of the computing CPU's register size, for example, 32-bits, 64-bits, and others. With aligning size, the CPU is able to load segment values, as one-to-one into its registers and execute the Boolean operation as one or least number of processing units, providing optimal performance.

A TLB is comprised of a plurality of ordered sequence of Descriptors, as many as to cover the largest signature identifier within the associated attribute. FIG. 4B shows the detail structure of a TLB, with all its Descriptors and corresponding Data groups. Hence, the Data group size is 16, or each Data group is comprised of 16 data segments. With software programming techniques, a Descriptor is linked to the next Descriptor in the sequence, the linkages are shown as (20), (22), and (24), and the linked Descriptors, are shown as starting from (10), to (12), to (14), then to the last (16). A Descriptor is also linked to its first Data group, one that corresponds to the first Descriptor's "1" bit, shown (40) corresponds to bit #0, then each subsequent Data group follows, shown as (42) corresponds to bit #2, and (44) corresponds to bit #31; hence, Descriptor #0 is linked to a series of contiguous data segments, with sequence from #0 to #47.

A TLB header that includes all its configured values, including but not limited to the attribute name/identifier, Descriptor segment size, data segment size, Data group size, total number of Descriptor segments, total number of data segments, and others is attached with each TLB.

These configuration values completely characterize the TLB and, among many usages, would be used to check compatibility between TLB before performing Boolean operations.

Boolean Operations for Two-Level Bitmaps

A Boolean operation performed between two TLB will first be performed between the corresponding pair of the aligned Descriptors. The same bit-wise Boolean operations will only be performed on the corresponding aligned Data groups from the two TLB that correspond to bit positions in the result Descriptor that have been set to "1".

FIG. 4C shows an attribute A's TLB is "AND" with attribute B's TLB, with first performing a bit-wise "AND" between the first aligned Descriptor #0 from attribute A and B—(10) and (12), respectively. The result attribute R's Descriptor #0—(14) has one "1" bit in bit position #2, therefore, the Data group corresponds to its Descriptor bit #2 from both attribute A's TLB and attribute B's TLB is "AND" to produce the result Data group for the result attribute R's Descriptor #0—(24). If the result Data group turns out to be an all-zero Data group, the corresponding Descriptor bit, which was previously set to "1", will be reset to "0" and the all-zero Data group will not be retained.

Note that the data segments' sequence values may not necessary be the same for the same bit position in two corresponding pair of Descriptors. In FIG. 4C, the data segment sequence starts from #16 to #31—(20) for attribute A's Descriptor #0's bit #2, however, the data segment sequence is from #0 to #15—(22) for the same Descriptor bit position for attribute B.

To complete the "AND" operation, repeat the above described process for each of the subsequent aligned pair of Descriptors for attribute A and B, if both attributes have the same number of Descriptors. Otherwise, if the two operand attributes do not have the same number of Descriptors, for an "AND" operation, stop the process at the lower sequence Descriptor of the two operands; while for all other Boolean operations, add padding all-zero Descriptors to the attribute with the lower sequence till it has the same number of Descriptors as the other operands and repeat the process to complete the Boolean operation.

The assumption made for the above described Boolean operation process is that the two attribute operands are "compatible". Two operands are compatible if and only if they are configured with the same values for these: 1) Descriptor segment size; 2) data segment size; 3) Data group size. If not compatible, one of the two operand attribute can be temporary or permanently converted to a new attribute based on the required compatible configuration values.

The resulted attribute TLB, from a Boolean operation assumes the configuration values of either operand TLB (both operands have the same configuration values); it can exist independently as is or it can be used an intermediate result to be feed into additional Boolean operations. In general, any complex formula of Boolean operations can be performed on one or more TLB to derive a final result TLB.

A Boolean operation can be performed on a selected subset of the Descriptors, or subset of data, from the corresponding operand TLB. Statistical data sampling and data partitioning for parallel processing to improve performance are two example usages.

Every TLB is self-contained and transportable. A TLB can be constructed separately and independently on separate servers, with its specific configured values. If needed, TLB can be transported into any common locations, computer servers for example, to perform Boolean or other operations to produce new meaningful and useful results.

Two-Level Bitmap Construction and Addressing Scheme

A TLB is constructed by adding each and every correspondent object, in ascending order by its signature identifier, to the associated attribute by setting the data bit position that equals to the object's signature identifier to "1". New Descriptors and its corresponding Data groups are added incrementally as required by setting the data bits.

In order to set a data bit at a specific position or address, the following need to be determined:

(I) Descriptor sequence number (II) Descriptor bit position (III) Data bit position within the Data group for the cited Descriptor bit Starting with the first bit address, if it falls within the first Descriptor #0, or if (I) equals to zero, then set the Descriptor bit to "1" as determined by (II); add a new Data group if necessary and not already existed and set the data bit within the Data group to "1" as determined by (III).

However, if (I) is greater than zero, then add padding all-zero Descriptors, starting from Descriptor #0 to one less than the value as determined by (I); No Data group is added for any padding Descriptor. Next, add the Descriptor as determined by (I) and follow the same steps above to set bit for (II) and (III) to "1".

Repeat the above process for the next bit address until the last, or the maximum signature identifier, associated with the attribute is reached. Padding Descriptors are also needed for gap(s) exists between the previous address and the current address.

Given the below configuration parameters, the formula to derive (I), (II), and (III) is as follow:

AV=address value

DGS=Data group size

DcptSize=a Descriptor segment size

DataSize=a data segment size $$AV/(DcptSize \times DataSize \times DGS) \quad (1)$$

$$\text{Remainder of } (1)/(DataSize \times DGS) \quad (2)$$

The quotient of (1) is the value for (I); the quotient of (2) is the value for (II); the remainder of (2) is the value for (III).

Given an example for the first address value is 16,898 (or AV=16898) and given that DGS=16, DcptSize=32 and DataSize=32, the results are:

(I)=1, or second Descriptor, #1

(II)=1, or second Descriptor bit, #1

(III)=2, or second bit, bit #1 in Data group

Continue with this example that the second and last address is 50,000 (or AV=50000), the results are:

(I)=3, or fourth Descriptor, #3

(II)=1, or second Descriptor bit, #1

(III)=336, or 336th bit, bit #335 in Data group

In summary, the constructed TLB for this example has 4 Descriptors, with 2 padded all-zero Descriptor #0 and Descriptor #2. Descriptor #1 bit #1 is set to "1" and the data bit #1 within its Data group is set to "1"; Descriptor #3 bit #1 is set to "1" and the data bit #335 within its Data group is set to "1".

Saving Two-Level Bitmap to Storage

One or a collection of TLB can be saved as a file, by writing in binary data format, to persistent disk storage and later retrieved for Boolean and other required operations. In order to write to a sequential file using software programming techniques, a TLB is collapsed from a two-level to a single level structure, which herein refers to Linear Bitmap structure (LBS).

The steps for constructing a LBS are: start with the first Descriptor, remove the linkage and append the set of contiguous data segments to behind the Descriptor, such that the Descriptor and its data segments are one set of linear and contiguous segments. Repeat the process for the next Descriptor and its data segments, where this Descriptor will follow the last data segment of the previous Descriptor. Repeat this process for the next till the last Descriptor.

A significant number of all-zero data segments could exist within the LBS; therefore, additional data compression can be applied to the LBS to reduce its size before saving to disk.

FIG. 5A shows a TLB, with a Data group size of 32, is being converted to its corresponding LBS using the described method. The LBS starts with the corresponding TLB header, next with Descriptor segment #0, follows by its corresponding collection of data segments, hence, from the first segment #0 to the last segment #95; then it continues on with the next Descriptor #1, follows by its data segment, and so on until the last Descriptor #N is reached.

Data Compression for LBS

Any appropriate binary data compression techniques can be used for a LBS, the present method employs a similar technique to Descriptors, which utilizes control segments, which herein refers to as Control Words (CW), to replace and therefore eliminate all-zero data segments, but at a more granular scale.

Each CW bit control a corresponding group of data segments, which herein refers to as a "compression group" (CG); if the CG contain at least one non-zero data segment, the corresponding CW bit is set to "1", otherwise, the CW bit is set to "0" to indicate that the data segments in this group are all-zero segments. Each consecutive CW bit controls the corresponding consecutive CG.

This CG size, which herein refers to as "compression ratio" (CR), is configurable to any positive integer but would be set to a small value, such as between 2 to 8, in order to achieve the best compression result. Both the CR value and a flag to indicate whether compression is used are recorded in the corresponding TLB header.

The compression method is carried out by examining for all-zero segments, starting from the first CG of data segments, then next group, till the last CG is reached. If a CG is comprised of all all-zero segments, set the corresponding CW bit to "0" and remove this group; otherwise, set the corresponding CW bit to "1" and retain the group.

FIG. 5B shows a sample LBS, with a Data group size of 32 and is shown with its first Descriptor #0, is being compressed using the described CW based method and the detail steps are shown in FIG. 5C. The CR is set to 2 and its CW segment size is 32 bits, which means each CW is controlling a maximum of 64 data segments (derived by 32-bits×2 segment/bit) in FIG. 5C. Note that CW #1—(12) controls the full first 64 data segments while CW #2—(14) controls the partial remaining 32 data segments, of Descriptor #0—(10), with only its bit #0 to #15 are used.

In FIG. 5C, the first group of segments, #0 and #1, are both zero segments, therefore they are removed and the corresponding CW #1's bit #0 is set to "0"; the next group, with segment #2 and #3, is retained since at least one segment, segment #2, is non-zero and CW #1's bit #1 is set to "1". This process is repeated until the last CW #1 bit is reached. In this example, all of CW #1's bits are set to "0", except bit #1 and #31, therefore two groups of 4 data segments are retained, while 60 out of the total 64 data segments are removed, or being compressed. Note that the first CW, hence, CW #1 is inserted after the Descriptor, and then the next CW, hence, CW #2, is inserted after the last segment of the previously compressed data.

Retrieving and Restoring Two-Level Bitmap from Storage

To restore a TLB from storage to memory, first retrieve the corresponding LBS from file to local memory, along with its corresponding TLB header that provides all its configuration values, next decompress the LBS if compression was previously applied, and lastly re-construct the TLB from the LBS.

To de-compress the LBS back to its un-compressed form, it is being a matter of inserting the removed groups of all-zero segments back to the appropriate locations within the compressed LBS. These insertion locations correspond to the "0" bit positions in the corresponding CW.

To construct the corresponding new un-compressed LBS, begin by examining the first bit of the first CW, if the bit value is "0", add an all-zero group of segments—group size is determined by the retrieved CR value, otherwise, if the bit value is "1", take the corresponding CG from the compressed LBS, hence the first CG, and add it to the un-compressed LBS. Then move to the next CW bit and repeat the described process until the last CW bit is reached.

The total number of restored data segments for the Descriptor is tracked and compare to the actual or expected number, calculated by multiplying the Data group size to the total number of "1" bits in the Descriptor, to determine if the above process needs to continue.

For this example LBS, the Group size is 32 and the total number of "1" bit in Descriptor #0 is 3, therefore the total number of data segments need to be restored is 32×3=96 data segments. After the first CW, only 64 data segments have been restored derived by multiplying the CW segment size by CR value, hence 32×2=64. Therefore, there is a remaining of 32 data segments, derived by 96−64=32, needs to be restored. The next segment in the compressed LBS is interpreted as the next CW, hence CW #2, and repeat the above described un-compressed LBS construction process, except that the examination would stop half way at CW #2's bit #15.

To re-construct the TLB from its corresponding LBS counterpart, it is done by decoupling the data segments from the end of its Descriptor and links them to the Descriptor, using the same software programming techniques that were used to link data segments to the original TLB.

What is claimed is:

1. A computer-implemented method of calculating required parameter values in order to generate a two-level bitmaps (TLB) for associating a collection of objects that which correspond to physical entities in an efficient manner by eliminating zero gap bits filled lower-level data bitmaps of said TLB, wherein each said object is assigned with an unique signature identifier, to a predefined set of attributes for the purpose of maintaining and inferring useful information about said objects, wherein top-level of said TLB containing an ordered sequence list of control segments, wherein each control segment containing a predetermined number of control bits, wherein each said control bit corresponds to a lower-level data group, wherein said data group containing a predetermined number of data segments, wherein a said data segment containing a predetermined number of bits, wherein said contiguous bits within said data group are assigned with an absolute sub-range of consecutive bit addresses, comprising the steps of:

For a given attribute,
a. sorting its corresponding associated collection of objects by their assigned signature identifiers in ascending order;
b. starting from first control bit of first said control segment, generating a corresponding physical data group if and only if at least one said object's identifier falls within said control bit's corresponding sub-range; if so, set to "1" for all respective bits within said data group with addresses equal to said objects' identifiers to indicate associations of said objects to said attribute and furthermore, set said control bit to "1" to indicate it has a physical corresponding data group; otherwise, set said control bit to "0" to indicate it has no physical data group, and thereby eliminating an all-zero bits filled data group, use below formula to derive corresponding parameter values for a said identifier:
  I. control segment sequence number=quotient value of (A);
  II. control bit position within said computed control segment in (I)=quotient value of (B);
  III. data bit position within corresponding data group for said computed control bit in (II)=remainder value of (B);
  wherein (A), (B) is defined as
    A. signature identifier/(control segment bit size× data segment bit size×number of data segments per data group);
    B. remainder value of (A)/(data segment bit size× number of data segments per data group);
c. repeat step (b) for next control bit of said control segment until either said control segment's last bit is reached or all associations for said collection of objects have been created;
d. repeat step (b) to (c), generating a new control segment and assigning it with next higher sequence number and next increasing sub-range of addresses, until all associations for said collection of objects have been created.

2. The method of claim 1, wherein said derived parameter values are used to generate said two-level bitmaps for corresponding sorted list of signature identifiers, further comprising the steps of:

For said attribute and first said signature identifier,
a. generating one or a plurality of control segments, wherein number of said control segments is determined by method of claim 1 step (b) item (I); each generated control segment is assigned with an increasing sequence number, with increment by one;
b. generating additional all-zero control segments to fill gaps between two adjacent signature identifiers if they do not have consecutive sequence number for its corresponding control segment;
c. setting said control segment bit position derived by method of claim 1 step (b) item (II) to "1", if not already set, indicating said object's correspondence to said attribute at control bit level;
d. generating corresponding data group for said control bit, if not already generated;
e. setting data bit position within said data group derived by method of claim 1 step (b) item (III) to "1", indicating said object's correspondence to said attribute at data bit level.

3. The method of claim 2, further comprising the steps of:
Repeat steps from claim 1 to 2 for next signature identifier in said sorted list, and continue for next identifier in sequence until last identifier is processed.

4. The method of claim 2, wherein only control bits that are set to "1" have a correspondence to a physical data group; no data group is generated otherwise.

5. The method of claim 2, wherein for a given said attribute, a method of generating a corresponding list of signature identifiers from its associated said two-level bitmaps comprising the steps of:

Determining relative range span by a control segment, derived by multiplying these configured values: (control segment bit size) by (data segment bit size) by (number of data segments per data group);

Determining relative range span by a single control bit, derived by multiplying these configured values: (data segment bit size) by (number of data segments per data group);

For each and every control segment of said attribute, from low to high sequence number, starting with first sequence number, locating first control segment comprised of one or more "1" control bits; then identifying positions of said "1" bits;

For each and every said control "1" bit within said control segment, from low to high order position, locating first "1" data bit within said control bit's corresponding data group, identifying said data bit position, then a method of determining absolute range value represented by said data "1" bit, or equivalently signature identifier comprising the steps of:

a. deriving absolute end range value represented by last control segment prior to current said control segment, derived by multiplying said prior control segment's sequence number by above said computed span range value for a control segment;

b. deriving offset range represented by said control "1" bit at its position, derived by multiplying said position by above said computed span range for a control bit;

c. deriving absolute range value for said data bit by adding values derived by step (a) and step (b) and position value of said current data bit;

d. appending to said list derived value from step (c) as a signature identifier;

e. repeat step (c) and (d) to generate signature identifiers for all data "1" bits for said data group.

6. The method of claim 2, wherein said two-level bitmaps generated for a said attribute can be saved as a sequential file to persistent disk storage by transforming said two-level bitmaps to a linear unit of plurality of bitmap segments by combining each control segment with its corresponding data group's data segments, if any created, wherein said linear unit of plurality of bitmap segments is compressed by a similar method of using a control segment, wherein each consecutive bit of said compression control segment corresponds to a consecutive unit of grouped data segments within said linear unit, wherein said group size is configurable and predefined; a method of inserting said compression control segments and setting its bits comprising the steps of:

For each and every control segment of said linear unit, starting from first control segment, a. deriving total number of data segments associated with said original control segment by multiplying number of "1" bits in said control segment by configured data group size;

b. inserting a new compression control segment after first control segment of said linear unit;

c. for each and every compression control segment bit, from low to high order bit, locating and examining its corresponding compression groups, which are located immediately after said compression control segment;

d. setting said compression control bit to "1" if said group is consist of at least one non-zero bit segment and said group is retained; otherwise, setting said compression control bit to "0" and said group is removed;

e. comparing total number of data segments examined thus far, derived by multiplying number of compression control size by defined compression group size, with total number of data segments for said original control segment, derived from step (a), if there are remaining data segments, then continue with inserting a new compression control segment after the last retained compression group and repeat steps from (c) to (e).

7. The method of claim 6, wherein said compressed linear unit can be restored back to its uncompressed form; a method of generating said new uncompressed linear unit comprising the steps of:

Loading said compressed linear unit and its configuration values to memory and determining its compression group size;

Locating each and every original control segment within said compressed liner unit, in order sequence, starting with first control segment;

Deriving total number of data segments belong to said original control segment by multiplying total number of said control "1" bits by configured data group size, a. Copying said control segment to said uncompressed linear unit;

b. Locating first compression control segment immediately after said original control segment, then for each and every said compression control segment bit, from low to high order bit;

c. If said control bit is equal to "1", copying corresponding group of data segments from said compressed linear unit to said uncompressed linear unit; otherwise, if control bit is equal to "0", generating a new group of all-zero data segments and adding to said uncompressed linear unit;

d. If total number of data segments restored thus far are less than total number of data segments belong to said original control segment, then interpret next segment immediately follows last restored data segment as next compression control segment and repeat steps (c) and (d).

8. The method of claim 6, wherein a method of restoring said attribute from its corresponding saved file comprising the steps of:

a. Retrieving said attribute's corresponding linear unit of plurality of segments from its corresponding file;

b. Decompressing said retrieved linear unit if was previously compressed with method of claim 7;

c. Converting said decompressed linear unit to its original two-level unit, structured with control segments linking to its corresponding data groups.

9. The method of claim 7, wherein a method of converting said linear unit of plurality of segments to its original two-level form for said attribute comprising the steps of:

Loading said linear unit and its configuration values into memory;

Locating each and every said control segment, in order sequence, from within said linear unit, starting with first control segment, a. Deriving total number of data segments that are associated with said control segment by multiplying number of said control "1" bits by configured data group size;

b. Extracting above derived number of data segments from behind said control segment in said linear unit and linking said group of data segments to said control segment;

c. Linking previous control segment to said current control segment, if applicable.

\* \* \* \* \*